United States Patent
Nakai et al.

(10) Patent No.: US 10,270,435 B2
(45) Date of Patent: Apr. 23, 2019

(54) CLOCK SIGNAL GENERATOR CIRCUIT

(71) Applicant: DENSO CORPORATION, Kariya, Aichi-pref. (JP)

(72) Inventors: Satoshi Nakai, Kariya (JP); Ippei Kawamoto, Kariya (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 15/980,797

(22) Filed: May 16, 2018

(65) Prior Publication Data

US 2019/0007034 A1    Jan. 3, 2019

(30) Foreign Application Priority Data

Jun. 30, 2017 (JP) ................................. 2017-128943

(51) Int. Cl.
| | |
|---|---|
| *H03K 5/1252* | (2006.01) |
| *G06F 1/08* | (2006.01) |
| *H03K 21/08* | (2006.01) |
| *H02M 3/07* | (2006.01) |

(52) U.S. Cl.
CPC ............ *H03K 5/1252* (2013.01); *G06F 1/08* (2013.01); *H03K 21/08* (2013.01); *H02M 3/07* (2013.01)

(58) Field of Classification Search
CPC ...... H03K 3/0315; H03K 3/133; H03K 3/135; H03K 2005/00097; H03L 7/0995–7/0998; H03L 7/0991–7/0994

See application file for complete search history.

(56) References Cited

U.S. PATENT DOCUMENTS

| | | | | |
|---|---|---|---|---|
| 5,208,558 A | * | 5/1993 | Shigehara | H03K 3/0307 331/116 FE |
| 5,404,402 A | * | 4/1995 | Sprunk | H01L 23/57 380/28 |
| 6,121,813 A | * | 9/2000 | Furuchi | H03K 5/13 327/278 |
| 6,507,247 B2 | * | 1/2003 | Langston | H03K 3/0315 331/47 |
| 6,667,928 B2 | * | 12/2003 | Honma | G11C 5/14 327/536 |
| 6,895,046 B1 | * | 5/2005 | Willis | H04B 15/02 363/20 |
| 6,903,577 B2 | * | 6/2005 | Tsuji | H03K 5/13 326/82 |

(Continued)

*Primary Examiner* — Thomas J. Hiltunen
(74) *Attorney, Agent, or Firm* — Posz Law Group, PLC

(57) ABSTRACT

A clock signal generator circuit includes a CR oscillator part, which outputs a clock signal having a frequency corresponding to a time constant determined by a capacitor and a resistor, and a frequency varying part. The frequency varying part includes a counter for performing a counting operation and varies a frequency of the clock signal by varying a resistance value of the resistor in correspondence to a count value of the counter. The resistor of the CR oscillator part includes plural resistive elements, one terminal of which are connected to a common node. The frequency varying part includes tri-state buffers, input terminals of which are connected in common and output terminals of which are connected to other terminals of the resistive elements, respectively, and varies the resistance value of the resistor by switching over states of the buffers in correspondence to the count value.

20 Claims, 12 Drawing Sheets

(56) References Cited

U.S. PATENT DOCUMENTS

| | | | | |
|---|---|---|---|---|
| 7,042,298 B2* | 5/2006 | Nakahi | ................. | H03K 3/014 |
| | | | | 331/158 |
| 7,808,328 B2* | 10/2010 | Tatschl-Unterberger | ................... | |
| | | | | H03K 3/0315 |
| | | | | 331/179 |
| 8,209,367 B2* | 6/2012 | Radja | ..................... | G06F 7/588 |
| | | | | 708/251 |
| 8,928,421 B2* | 1/2015 | Cheng | ....................... | H03L 7/00 |
| | | | | 323/282 |
| 9,077,351 B2* | 7/2015 | Park | ....................... | H03L 7/085 |
| 2008/0032640 A1 | 2/2008 | Kawai et al. | | |
| 2008/0180182 A1* | 7/2008 | Chang | ................. | H03H 11/265 |
| | | | | 331/57 |

* cited by examiner

<COMPARISON EXAMPLE (NO FREQUENCY SPREADING)>

<EMBODIMENT (FREQUENCY SPREADING)>

FM BAND (76 MHz - 108 MHz)
<MODULATION RATE OF SPREADING: 20%>

FM BAND (76 MHz - 108 MHz)
<MODULATION RATE OF SPREADING: 10%>

FM BAND (76 MHz - 108 MHz)
<MODULATION RATE OF SPREADING: 5%>

FM BAND (76 MHz - 108 MHz)
<MODULATION RATE OF SPREADING: 0%>

DAB BAND (171 MHz – 245 MHz)
<MODULATION RATE OF SPREADING: 20%>

DAB BAND (171 MHz – 245 MHz)
<MODULATION RATE OF SPREADING: 10%>

DAB BAND (171 MHz – 245 MHz)
<MODULATION RATE OF SPREADING: 5%>

DAB BAND (171 MHz – 245 MHz)
<MODULATION RATE OF SPREADING: 0%>

CLOCK SIGNAL GENERATOR CIRCUIT

CROSS REFERENCE TO RELATED APPLICATION

The present application is based on Japanese patent application No. 2017-128943 filed on Jun. 30, 2017, the whole contents of which are incorporated herein by reference.

FIELD

The present disclosure relates to a clock signal generator circuit, which generates a clock signal.

BACKGROUND

For realizing a size reduction of a charge pump circuit, it is required to reduce sizes of circuit elements such as capacitors and switching elements, for example. The size reduction however lowers a voltage boosting ability. It is thus proposed to increase a frequency of an operation clock signal for attaining the size reduction while maintaining the voltage boosting ability.

An increase of the frequency of the clock signal results in generation of high frequency noises. For a vehicle application, in particular, it becomes difficult to meet a vehicle standard because of high frequency noises of an FM band, DAB band and the like.

For countering the high frequency noises, it is proposed to spread the frequency of the clock signal. For example, a frequency spreading circuit for spreading a frequency by adjusting a slope of a constant current is disclosed in the following patent document.

Patent document: JP 4240072 (US 2008/0032640 A1)

Since this conventional frequency spreading circuit is of a constant current type, it takes a certain period for stabilizing the current. Further, since a comparator is used, it is difficult to operate at high speeds, for example, over 1 MHz. Still further, since the conventional frequency spreading circuit needs a large number of circuit elements and is sized large, it is not suitable for application to small-sized products.

SUMMARY

It is therefore an object of the present disclosure to provide a clock signal generator circuit, which is able to spread a frequency without increasing a circuit scale.

According to one aspect, a clock signal generator circuit comprises a CR oscillator part and a frequency varying part. The CR oscillator part includes a capacitor and a resistor and outputs a clock signal having a frequency corresponding to a time constant determined by the capacitor and the resistor. The frequency varying part includes an operation part, which performs a predetermined operation and outputs a signal corresponding to its operation state, and varies the frequency of the clock signal by varying a resistance value of the resistor in correspondence to the signal outputted from the operation part. The resistor includes plural resistive elements, one terminals of which are connected to a common node. The frequency varying part includes plural buffers having input terminals connected in common and output terminals connected to other terminals of the resistive elements, respectively, and are switchable between a normal operation state and a high impedance state. The frequency varying part varies the resistance value of the resistor by switching over states of the buffers in correspondence to the signal outputted from the operation part.

DETAILED DESCRIPTION OF THE EMBODIMENT

Figure 1:
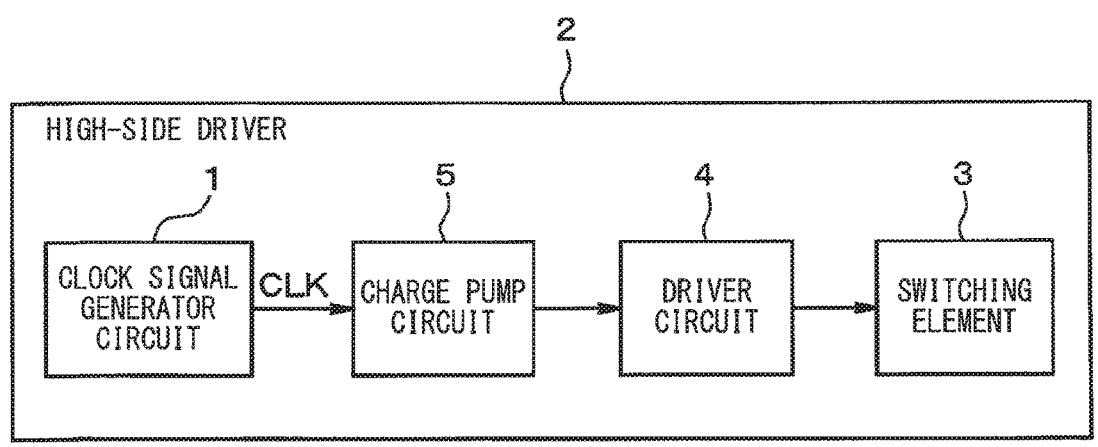
FIG. 1 is a schematic diagram showing a configuration of a high-side driver according to a first embodiment.

A clock signal generator circuit according to the present disclosure will be described below with reference to plural embodiments shown in the drawings. In the following description, substantially same configurations among the embodiments are designated with same reference numerals for simplicity.

First Embodiment

A first embodiment will be described below h reference to FIG. 1 to FIG. 8.

As shown in FIG. 1 a clock signal generator circuit 1 according to the first embodiment is provided in a high-side driver 2 for a vehicle. The high-side driver 2 includes, for example, a switching element 3, which is an N-channel power MOS transistor operable as a high-side switch, a driver circuit 4 for driving the switching element 3 and a charge pump circuit 5 for generating a driving voltage to turn on the switching element 3.

The clock signal generator circuit 1 generates a clock signal CLK, which is used as an operation clock of the charge pump circuit 5. In the first embodiment, for reducing a size and maintaining a voltage boosting ability of the charge pump circuit 5, a frequency of the clock signal CLK is set to a relatively high frequency (for example, over 1 MHz), specifically 6 MHz. The charge pump circuit 5 generates a driving voltage by boosting an inputted power supply voltage and supplies the circuit 4 with the driving voltage.

Figure 2:
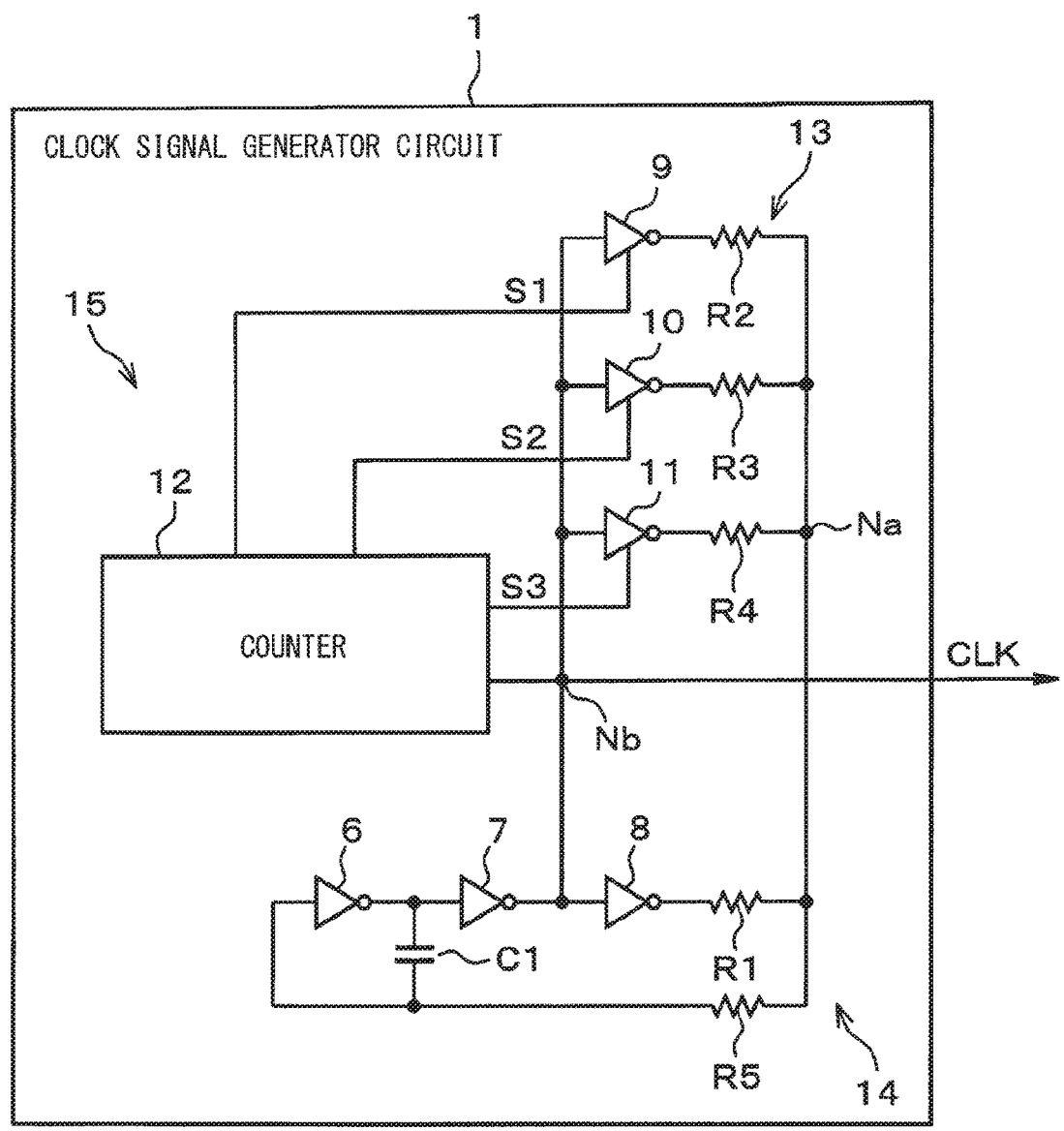
FIG. 2 is a schematic diagram showing a detailed configuration of a clock signal generator circuit according to the first embodiment.

The clock signal generator circuit 1 for generating the clock signal CLK may be configured as shown in FIG. 2, for example. As one example, the clock signal generator circuit 1 is configured as a CR oscillator circuit, which includes a capacitor C1, resistive elements R1 to R5, buffers 6 to 11, which are inverting buffers, and a counter 12.

An output terminal of the buffer 6 is connected to one terminal of the capacitor C1 and an input terminal of the buffer 7. An input terminal of the buffer 6 is connected to the other terminal of the capacitor C1 and to a common node Na through the resistive element R5. An output terminal of the buffer 7 is connected to a common node Nb, which is an output node of the clock signal CLK. An input terminal of the buffer 8 is connected to the node Nb and an output terminal of the buffer 8 is connected to the node Na through the resistive element R1.

Each of the buffers 9 to 11 is a tri-state inverter, which is switchable to a normal operation state for outputting an inverted signal of an input signal and a high impedance state. Input terminals of the buffers 9 to 11 are connected to the node Nb. Output terminals of the buffers 9 to 11 are connected to the node Na through the resistive elements R2 to R4, respectively. Output sides of the resistive elements R1 to R4 are connected in common at the node Na. The input terminals of the buffers 8 to 11 are connected in common at the node Nb. The output terminals of the buffers 8 to 11 are connected to input sides of the resistive elements R1 to R4, respectively.

The buffer 8 may alternatively be a tri-state inverter similarly to the buffers 9 to 11. In this case, the buffer 8 need be switched to be in the normal operation state continuously.

The counter 12 is configured to perform a counting operation by using the clock signal CLK as its clock and outputs a count value of 3 bits, for example. The counter 12 may alternatively be configured to perform the counting operation by receiving a clock signal different from the clock signal CLK from an external side and counting such a different clock signal. In the first embodiment, the counter 12 is an operation part, which performs a predetermined operation and outputs a signal corresponding to its operation state. In this case, the counting operation of the counter 12 is the predetermined operation.

Output signals S1 to S3, which indicate a count value of 3 bits of the counter 12, are applied to switchover control terminals of the buffers 9 to 11, respectively. The buffers 9 to 11 are switched over to operation states in correspondence to signal levels (high and low) applied to the switchover control terminals, respectively. Specifically, the buffers 9 to 11 are switched over to the normal operation states when high-level signals (for example, circuit power supply voltage +5V) are applied to the switchover control terminals, respectively. The buffers 9 to 11 are switched over to the high impedance states when low-level signals (for example, circuit reference potential 0V) are applied to the switchover control terminals, respectively In the configuration described above, the capacitor C1, a resistor 13 formed of the resistive elements R1 to R5 and buffers 6 to 11 form a CR oscillator part 14. The CR oscillator part 14 outputs the clock signal CLK, the frequency of which corresponds to a time constant determined by a static capacitance value of the capacitor C1 and a resistance value of the resistor 13. Further, the counter 12 and the buffers 8 to 11 form a frequency varying part 15. The frequency varying part 15 varies the frequency of the clock signal CLK by varying the resistance value of the resistor 13 in accordance with the count value of the counter 12.

According to this configuration, the operation states of the buffers 9 to 11 are switched over in correspondence to the output signals S1 to S3 indicating the count value of 3 bits outputted from the counter 12 of the frequency varying part 15. As a result, the resistance value of the resistor 13 in the CR oscillator part 14 is varied. Since a charging and discharging current of the capacitor C1 varies with a variation in the resistance value of the resistor 13, the frequency of the clock signal CLK generated by the CR oscillator part 14 is varied, that is, spread.

In this case, the frequency is varied in steps by the frequency varying part 15. The number of steps varies with a number of bits of the counter 12 and a number of series circuits, which are formed of tri-state buffers and resistive elements. For convenience of description, the numbers of the series circuits and the bits are assumed exemplarily to be 3. The numbers may however be 2, 4 or more. A range of frequency variation caused by the frequency varying part 15 for each step is determined by resistance values of the resistive elements R2 to R4. For this reason, the resistance values of the resistor elements R2 to R4 may be set to attain a desired variation amount of the frequency.

The frequency varying part 15 varies the frequency so that an average value Fave of the frequency of the clock signal CLK coincides a desired target value. In the following description, a modulation rate defined in the following equation is used as an index, which indicates a variation amount of the frequency (variation width of frequency) caused by the frequency varying part 15. Here, a maximum value and a minimum value of the varied frequency are Fmax and Fmin, respectively.

$$\text{Modulation rate} = (F\text{max} - F\text{min})/F\text{ave}$$

As defined by the equation described above, the modulation rate is calculated by dividing the frequency variation amount (Fmax-Fmin) of the clock signal CLK by the average value (Fave) and hence different from a modulation rate, which is used generally.

Figure 3:
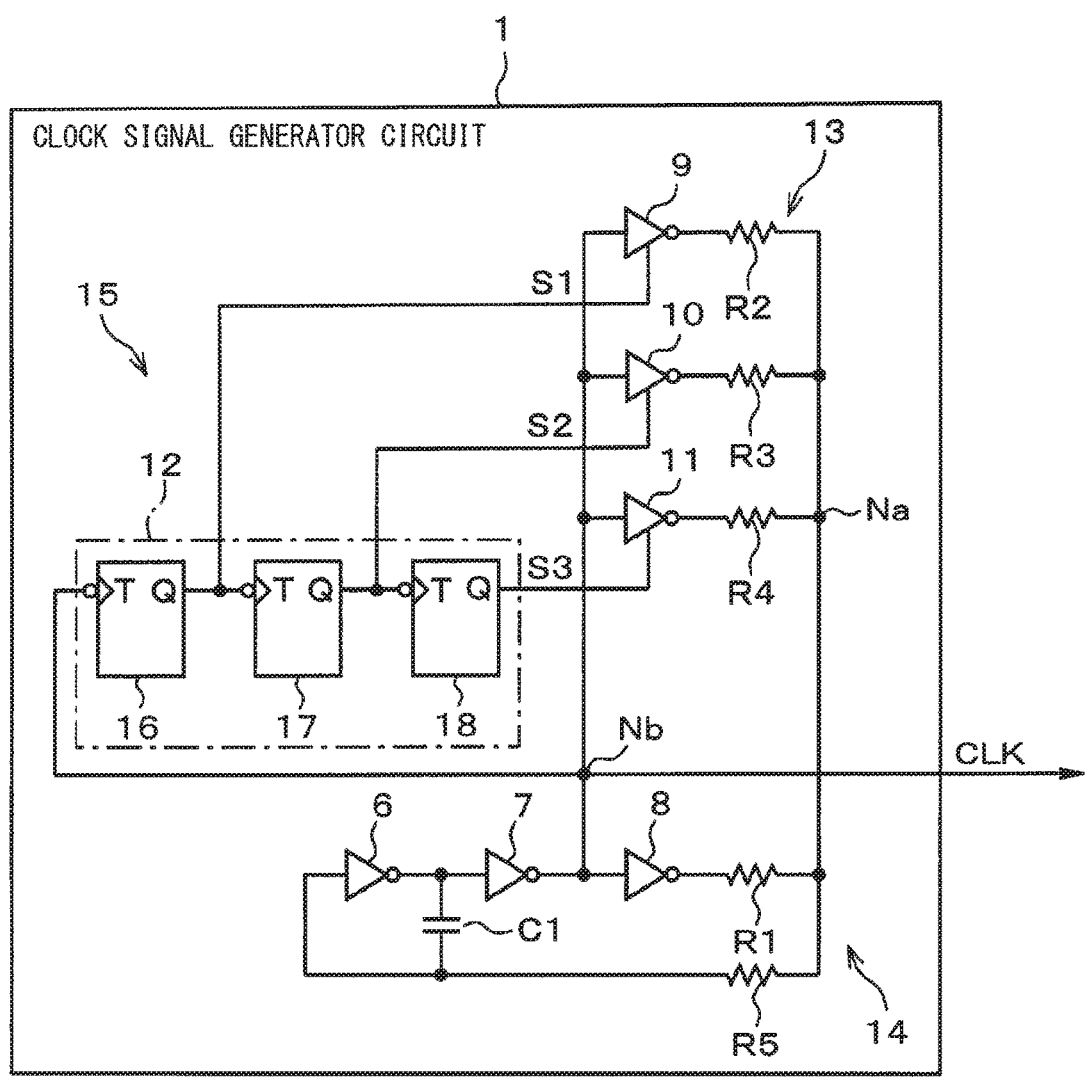
FIG. 3 is a schematic diagram showing a detailed configuration of a counter according to the first embodiment.

The counter 12, which performs the counting operation, may be configured as shown in FIG. 3, for example. In this example, the counter 12 is a binary counter formed of three stages of T-type flip-flops 16 to 18. Each of the flip-flops 16 to 18 is configured to be triggered by a negative edge. The counter 12 thus performs up-counting as the counting operation.

The flip-flop 16 of the first stage receives the clock signal CLK at its clock input terminal. The flip-flops 17 and 18 of the second and third stages receive output signals of preceding stages, respectively. Output signals of the flip-flops 16 to 18 are applied to the buffers 9 to 11 as the output signals S1 to S3, respectively.

According to this configuration described above, when the count value of the counter 12 is "000", that is, all of the output signals S1 to S3 are at low levels, the resistive elements R2 to R4 are in electrically disconnected states between the nodes Na and Nb. However, the resistive element R1 is connected between the nodes Na and Nb through the buffer 8, which is in the normal operation state continuously. For this reason, the CR oscillator part 14 continues its oscillation operation and outputs the clock signal CLK continuously. The first embodiment described above provides the following advantage.

According to the clock signal generator circuit 1 configured as described above, the frequency of the clock signal CLK is varied with the count value of the counter 12 and the frequency is spread. In this case, since the frequency is spread differently from the conventional constant current method and without a comparator, it is possible to operate at high speeds, for example, over 1 MHz. Further, the number of required circuit elements is not large and hence the circuit size is reduced to be small. For this reason, the clock signal generator circuit 1 configured as described above, it is suitably applied to a device such as the high-side driver 2, which is desired to be small-sized.

According to the first embodiment, since the frequency is spread as described above, it is of advantage that high frequency noises generated by the charge pump circuit 5 are reduced. This advantage will be described below with reference to FIG. 4A to FIG. 8, which show simulation results of a circuit operation. In the simulations corresponding to FIG. 4A to FIG. 8, the number of series circuits, each of which is formed of a tri-state buffer and a resistive element connected between the nodes Na and Nb, and the number of bits of the counter 12 are 7. That is, the simulation is conducted by varying the frequency in 7 steps.

Figure 4A:
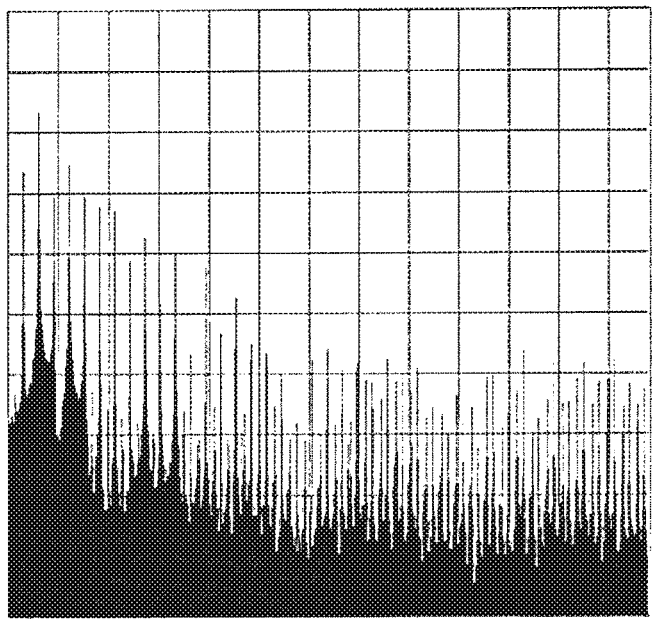
FIG. 4A and FIG. 4B are spectrum diagrams showing simulation results of a circuit operation in a high frequency band in a comparison example and the first embodiment, respectively.

FIG. 4A shows, as a comparison example, a spectrum (frequency distribution) of a high frequency band (for example, range from 1 MHz to 250 MHz) in case of performing no frequency spreading of the clock signal CLK. As shown in this example, a high frequency noise of a very high level is generated because of a circuit current (charging and discharging current) and a through current in the charge pump circuit 5, to which the clock signal CLK is supplied, in case of performing no frequency spreading.

Figure 4B:
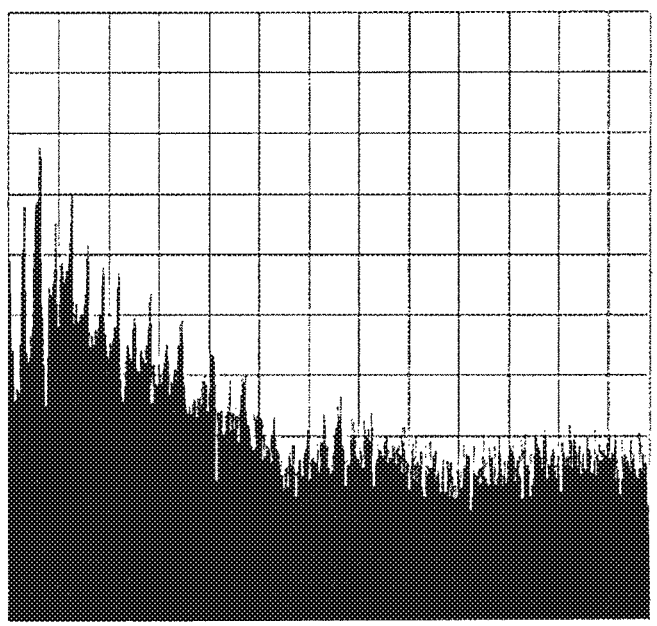
Figure 5A:
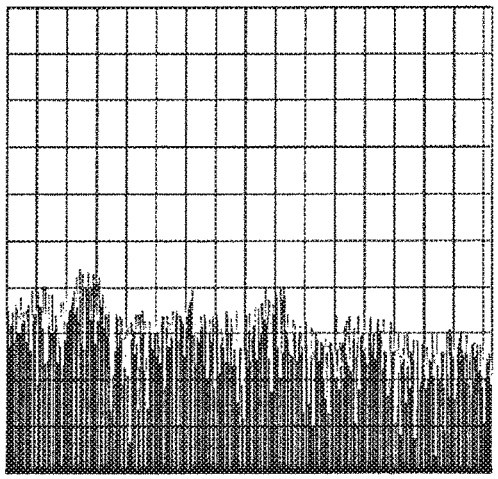
FIG. 5A to FIG. 5D are spectrum diagrams showing simulation results of a circuit operation with different modulation rates in an FM band.
Figure 5B:
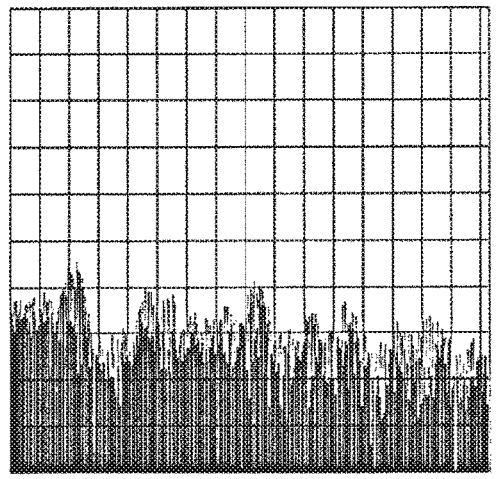
Figure 5C:
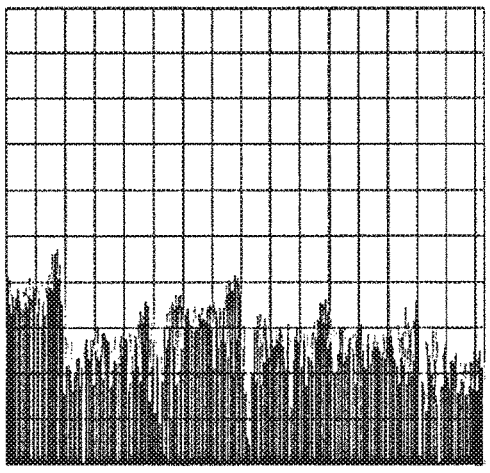
Figure 5D:
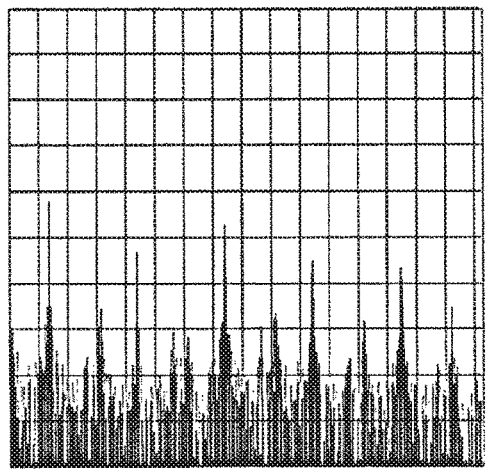
Figure 6A:
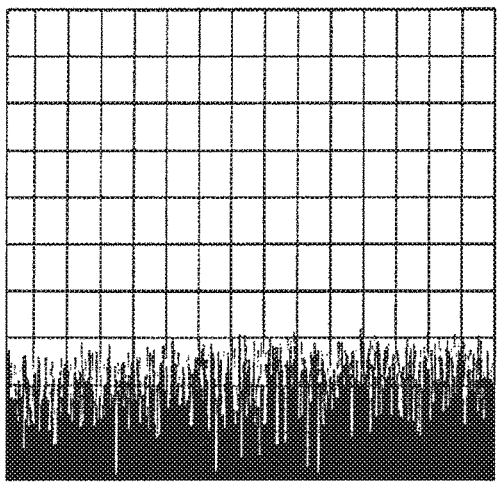
FIG. 6A to FIG. 6D are spectrum diagrams showing simulation results of a circuit operation with different modulation rates in a DAB band.
Figure 6B:
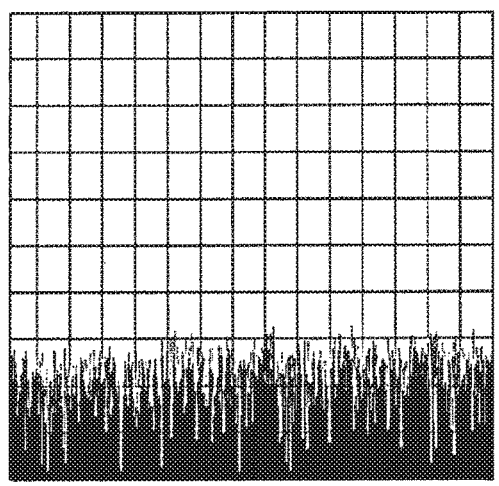
Figure 6C:
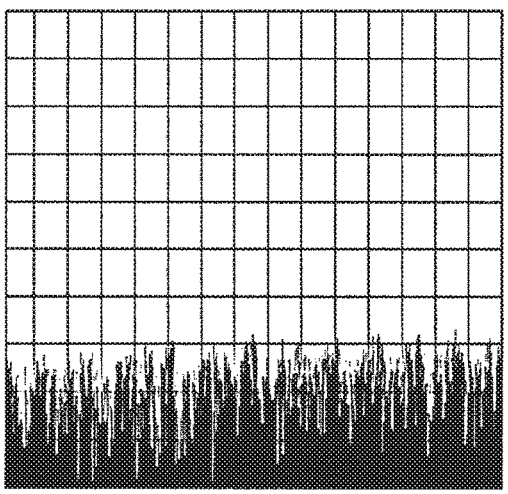
Figure 6D:
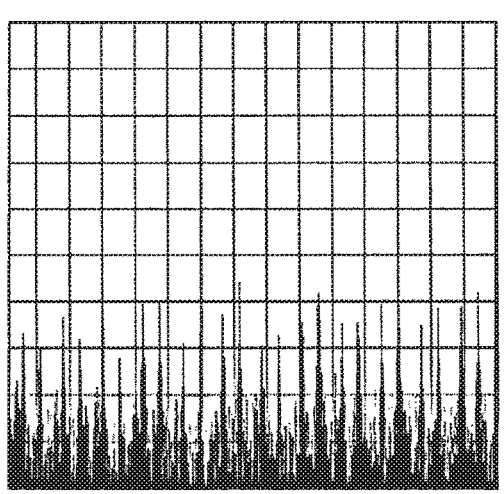

According to the dock signal generator circuit 1 of the first embodiment, the frequency spreading is performed by varying the frequency of the clock signal CLK in correspondence to the count value of the counter 12. As a result, according to the first embodiment, the high frequency noise of the charge pump circuit 5 is reduced to a very low level as shown in FIG. 4B.

FIG. 5A to FIG. 5D show spectrums of the FM band (76 MHz to 108 MHz) in case that the modulation rates are varied in four patterns (20%, 10%, 5% and 0%), respectively. FIG. 6A to FIG. 6D show spectrums of the DAB band (171 MHz to 245 MHz) in case that the modulation rates are varied also in four patterns (20%, 10%, 5% and 0%), respectively. With the modulation rate 0%, the frequency spreading is not performed. As evident from FIG. 5A to FIG. 5D and FIG. 6A to FIG. 6D, the advantageous level of high frequency noise reduction varies with the modulation rate. Specifically, the high frequency noise reduction increases as the modulation rate increases. For this reason, the modulation rate is set in correspondence to the desired level of high frequency noise reduction.

Figure 7:
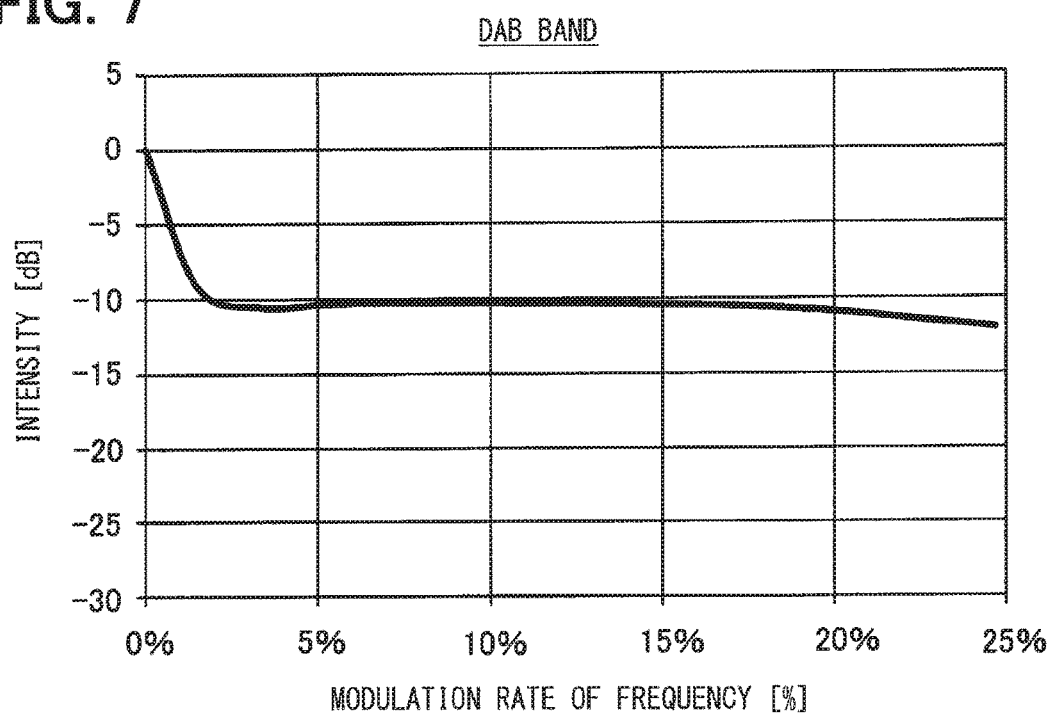
FIG. 7 is a schematic diagram showing a simulation result of a circuit operation and a relation between a noise intensity and a frequency modulation rate in a DAB band.
Figure 8:
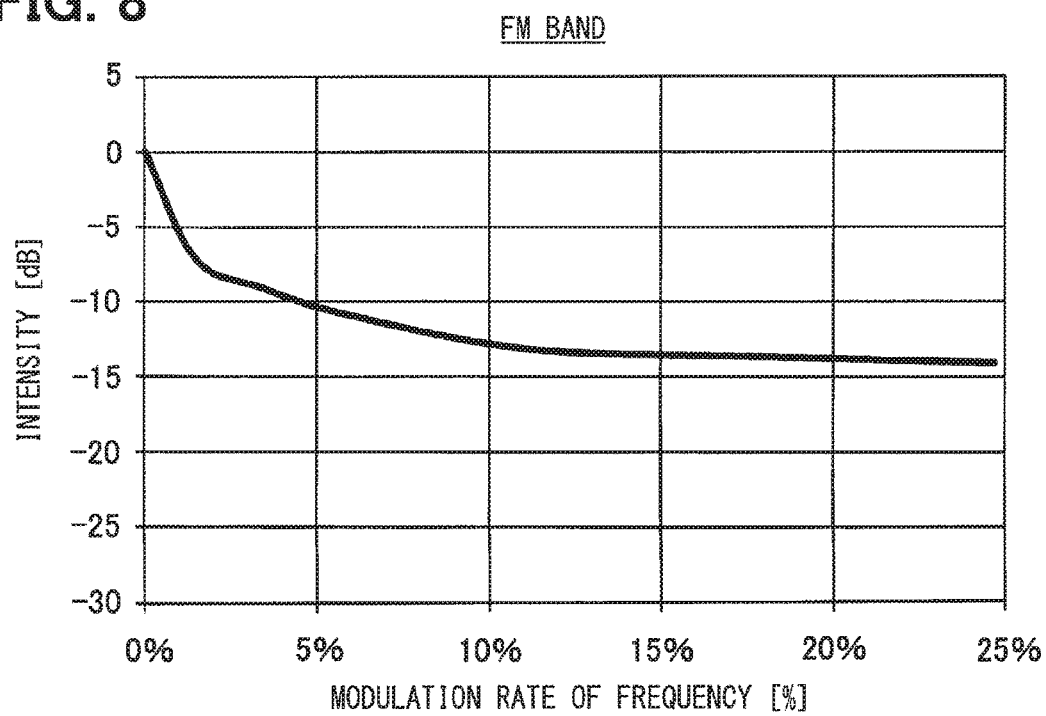
FIG. 8 is a spectrum diagram showing a simulation result of a circuit operation and a relation between a noise intensity and a frequency modulation rate in an FM band.

FIG. 7 is a graph showing a relation between noise intensity and the modulation rate in the DAB band based on a result of simulation, in which the modulation rate is varied more finely. FIG. 8 is a graph showing a relation between noise intensity and the modulation rate in the FM band based on a result of simulation, in which the modulation rate is varied more finely. In each of FIG. 7 and FIG. 8, an axis of ordinate indicates a value of intensity [dB] relative to a reference (0%), at which the frequency spreading is not performed. It is understood from FIG. 7 that, in the DAB band, the noise intensity is reduced to about a minimum value at the modulation rate 2% (0.02) and remains the same as the modulation rate increases. It is understood from FIG. 8 that, in the FM band, the noise intensity is reduced to about a minimum value at the modulation rate 12.9% (0.129) and remains the same as the modulation rate increases.

For this reason, the modulation rate is set preferably to be 2% or higher in case that the clock signal generator circuit 1 is used in an application, in which the high frequency noise of the DAB band is likely to be generated. Further, the modulation rate is set preferably to be 12.9% or higher in case that the clock signal generator circuit 1 is used in an application, in which the high frequency noise of the FM band is likely to be generated. With such setting of the modulation rates as described above, the high frequency noise is restricted from being generated in the applications of the clock signal generator circuit 1. As a result, it is possible for the clock signal generator circuit 1 to satisfy a standard required for the application in the vehicle.

Second Embodiment

A second embodiment will be described below with reference to FIG. 9.

Figure 9:
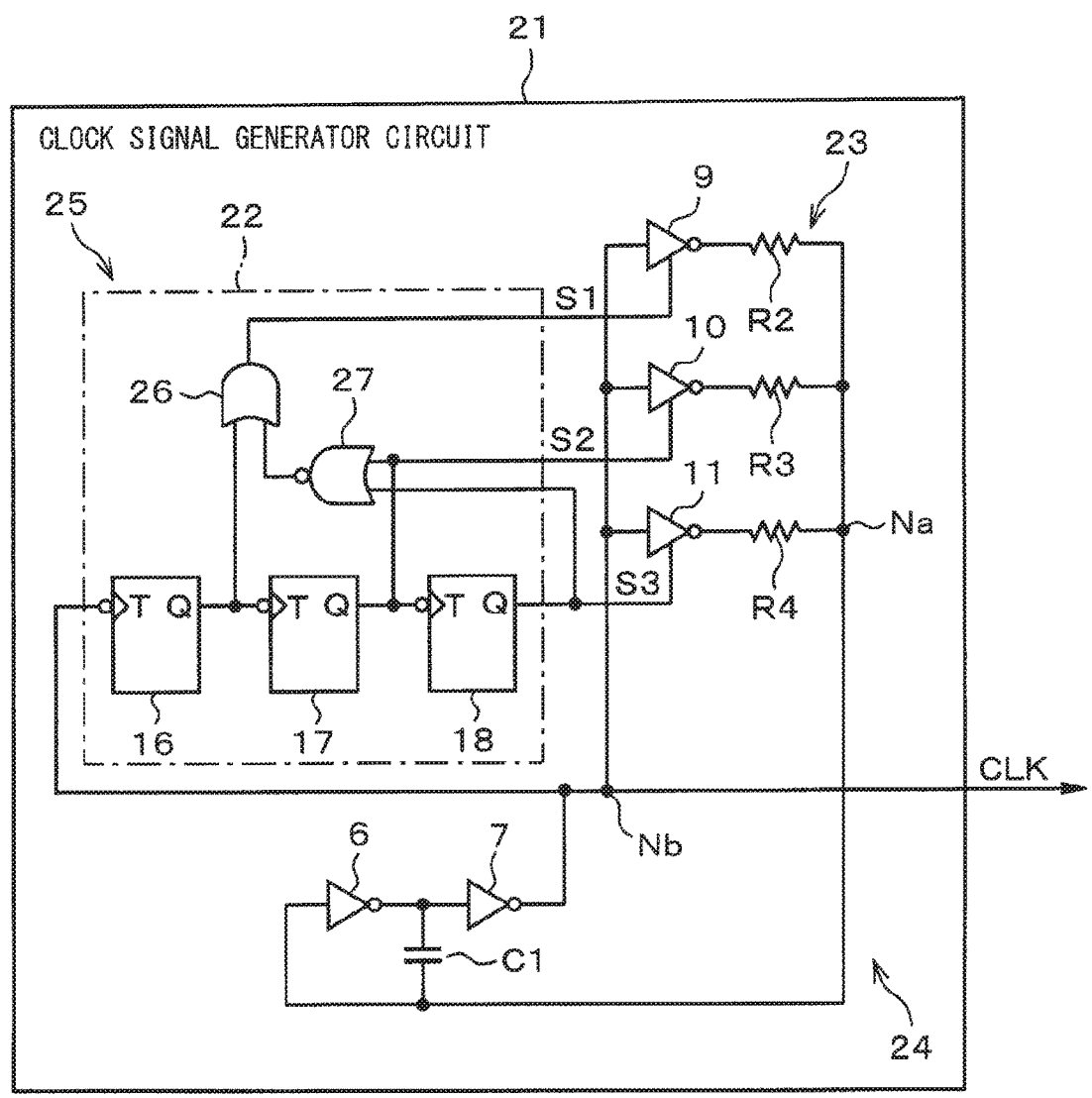
FIG. 9 is a schematic diagram showing a detailed configuration of a clock signal generator circuit according to a second embodiment.

As shown in FIG. 9, a clock signal generator circuit 21 according to the second embodiment is different from the clock signal generator circuit 1 of the first embodiment in that the buffer 8 of the first embodiment is not provided and a counter 22 is provided in place of the counter 12. A CR oscillator part 24 is formed of the capacitor C1, a resistor 23 formed of the resistive elements R2 to R4, buffers 6, 7, 9 to 11. A frequency varying part 25 is formed of the counter 22 and the buffers 9 to 11.

The counter 22 includes an OR circuit 26 and a NOR circuit 27 in addition to the configuration of the counter 12. The output signal of the flip-flop 16 is applied to one input terminal of the OR circuit 26. The output signal of the flip-flop 17 is applied to one input terminal of the NOR circuit 27. The output signal of the flip-flop 18 is applied to the other input terminal of the NOR circuit 26. An output signal of the NOR circuit 27 is applied to the other input terminal of the OR circuit 26.

According to the configuration described above, the output signal of the OR circuit 26 is an output signal S1 for switching over the operation state of the buffer 9. The output signals of the flip-flops 17 and 18 are output signals S2 and S3 for switching over the operation states of the buffers 10 and 11, respectively.

The second embodiment also provides the similar advantage as that of the first embodiment. Since the buffer 8 and the resistive element R1 of the first embodiment are not provided in the configuration described above, the resistive elements R2 to R4 are electrically disconnected from the nodes Na and Nb and the CR oscillator part 24 may potentially stop its oscillation in case that the count value of the binary counter formed of three flip-flops 16 to 18 is "000."

According to the configuration described above, however, the OR circuit 26 and NOR circuit 27, which receive the output signals of the flip-flops 16 to 18, are provided so that the output signal of the OR circuit 26 is used as the output signal S1 for switching over the operation state of the buffer 9. As a result, even in case that the count value is "000," the output signal S1 becomes the high level. It never arises that the output signals S1 to S3 all becomes the low levels. That is, according to the configuration described above, at least one of the buffers 9 to 11 is in the normal operation state continuously. According to the second embodiment, similarly to the first embodiment, the CR oscillator part 24 does not stop its oscillation and the clock signal CLK is outputted continuously.

Third Embodiment

A third embodiment will be described below with reference to FIG. 10.

Figure 10:
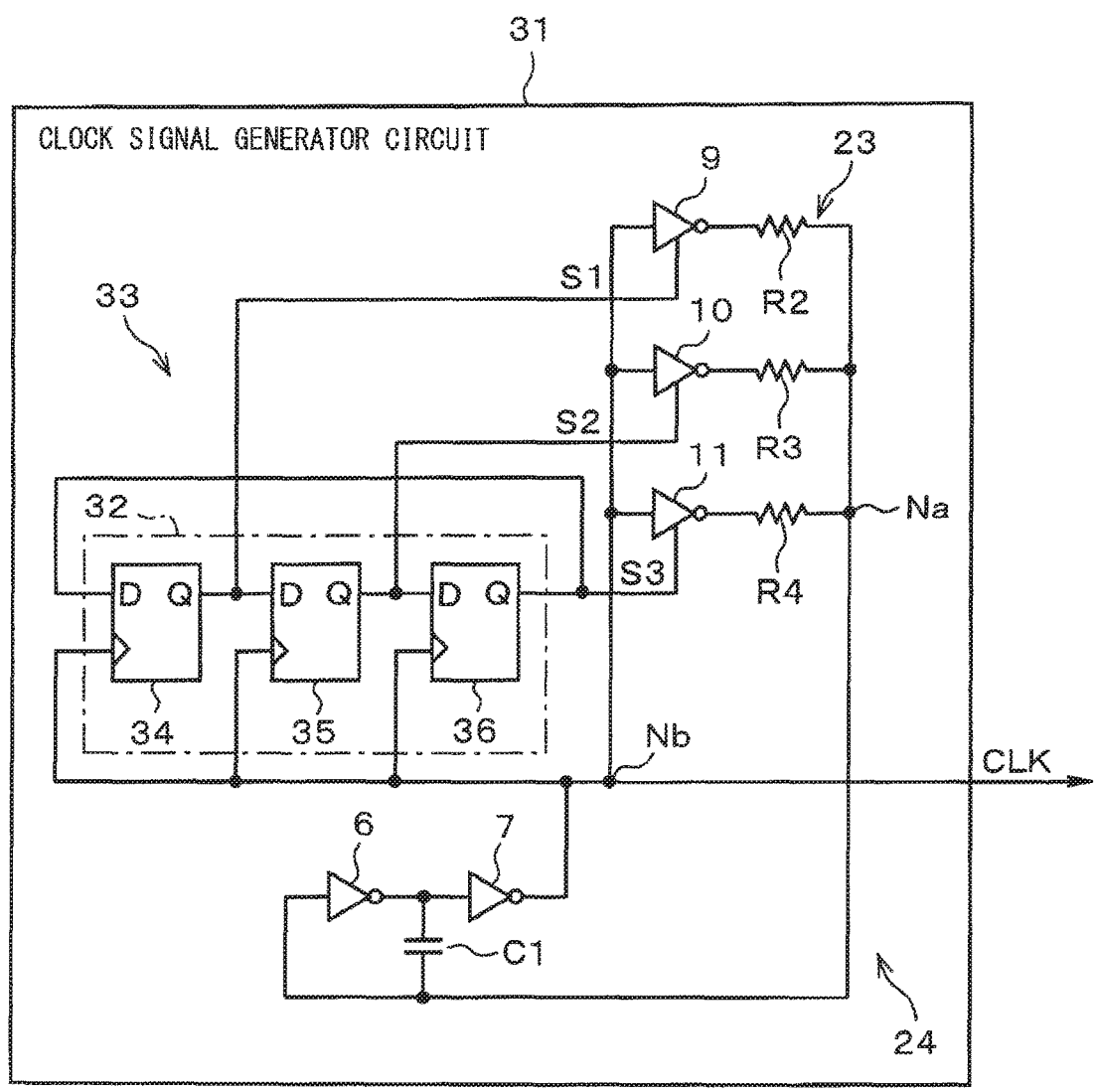
FIG. 10 is a schematic diagram showing a detailed configuration of a clock signal generator circuit according to a third embodiment.

As shown in FIG. 10, a clock generator circuit 31 according to the third embodiment is different from the clock signal generator circuit 21 of the second embodiment in that a counter 32 is provided in place of the counter 22. A frequency varying part 33 is formed of the counter 32 and the buffers 9 to 11.

The counter 32 is a ring counter, which is formed of three stages of D-type flip-flops 34 to 36. The clock signal CLK is applied to a clock terminal of each of the flip-flops 34 to 36. To an input terminal D of the flip-flop 34 of the first stage (initial stage), an output signal of the flip-flop 36 of a third stage (last stage) is applied. To input terminals of the flip-flop 35 of a second stage and the flip-flop 36 of the third stage, output signals of preceding stages are applied, respectively. The output signals of the flip-flops 34 to 36 are applied to the buffers 9 to 11 as output signals S1 to S3 of the counter 32, respectively.

In the configuration described above, the flip-flop 34 has a set terminal or a reset terminal. The counter 32 is set or reset at an initial state so that the output signal of the flip-flop 34 becomes a high level. The counter 32 thus starts its counting operation. The second embodiment also provides the similar advantage as the embodiments described above.

Fourth Embodiment

A fourth embodiment will be described below with reference to FIG. 11.

Figure 11:
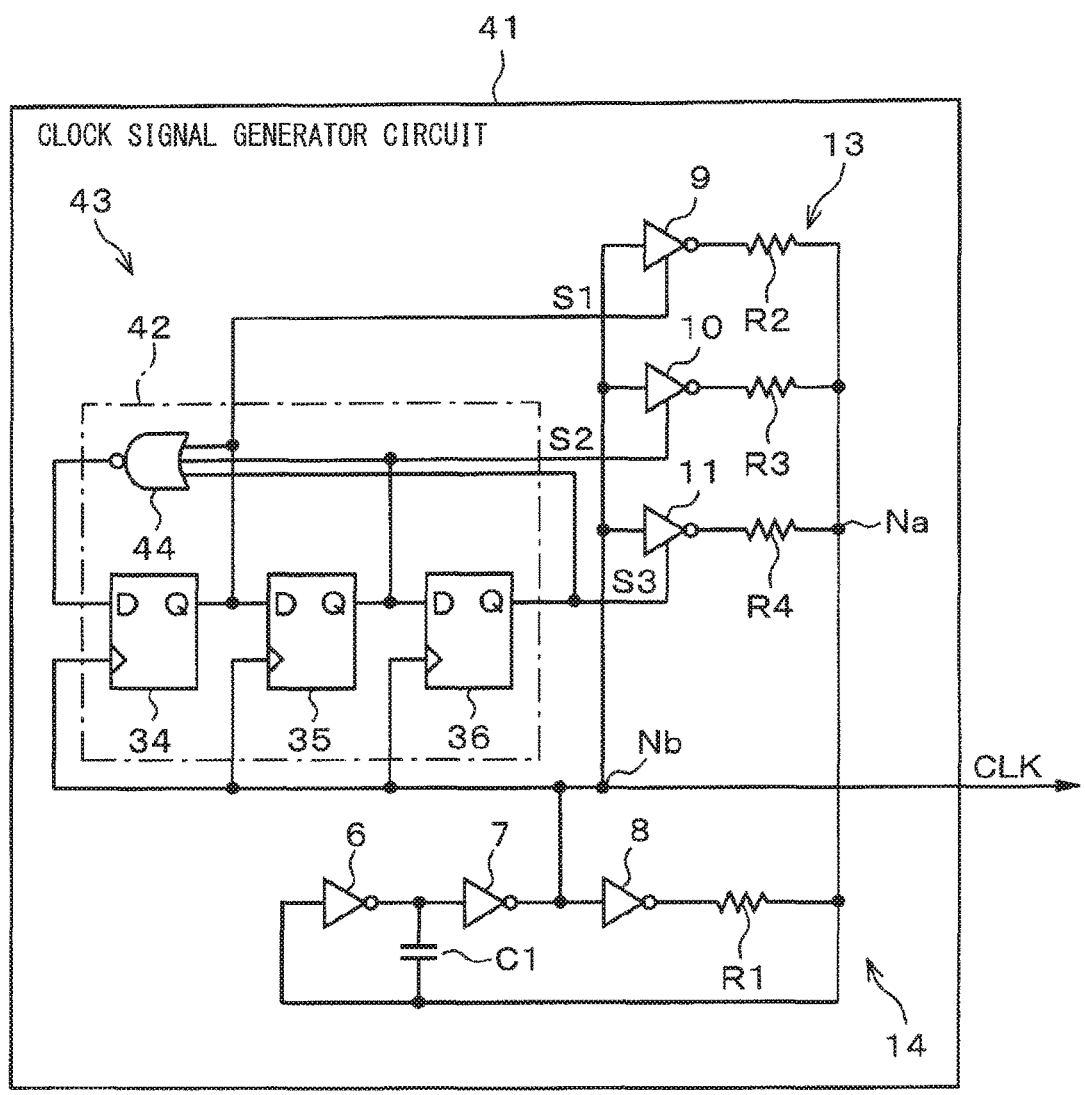
FIG. 11 is a schematic diagram showing a detailed configuration of a clock signal generator circuit according to a fourth embodiment.

As shown in FIG. 11, a clock generator circuit 41 according to the present embodiment is different from the clock signal generator circuit 1 of the first embodiment in that a counter 42 is provided in place of the counter 12 and the resistive element R5 is not provided. A frequency varying part 43 is formed of the counter 42 and the buffers 9 to 11.

The counter 42 includes a NOR circuit 44 in addition to the configuration of the counter 32 of the third embodiment shown in FIG. 10. The output signals of the flip-flops 34 to 36 are applied to three input terminals of the NOR circuit 44. The output signal of the NOR circuit 44 is applied to an input terminal D of the flip-flop 34 of the first stage (initial stage).

The counter 42 configured as described above can start counting its operation without configuring the flip-flop 34 to have the set terminal or the reset terminal as opposed to the third embodiment. The fourth embodiment configured as described above also provides the similar advantage as the embodiment described above.

Fifth Embodiment

A fifth embodiment will be described below with reference to FIG. 12.

Figure 12:
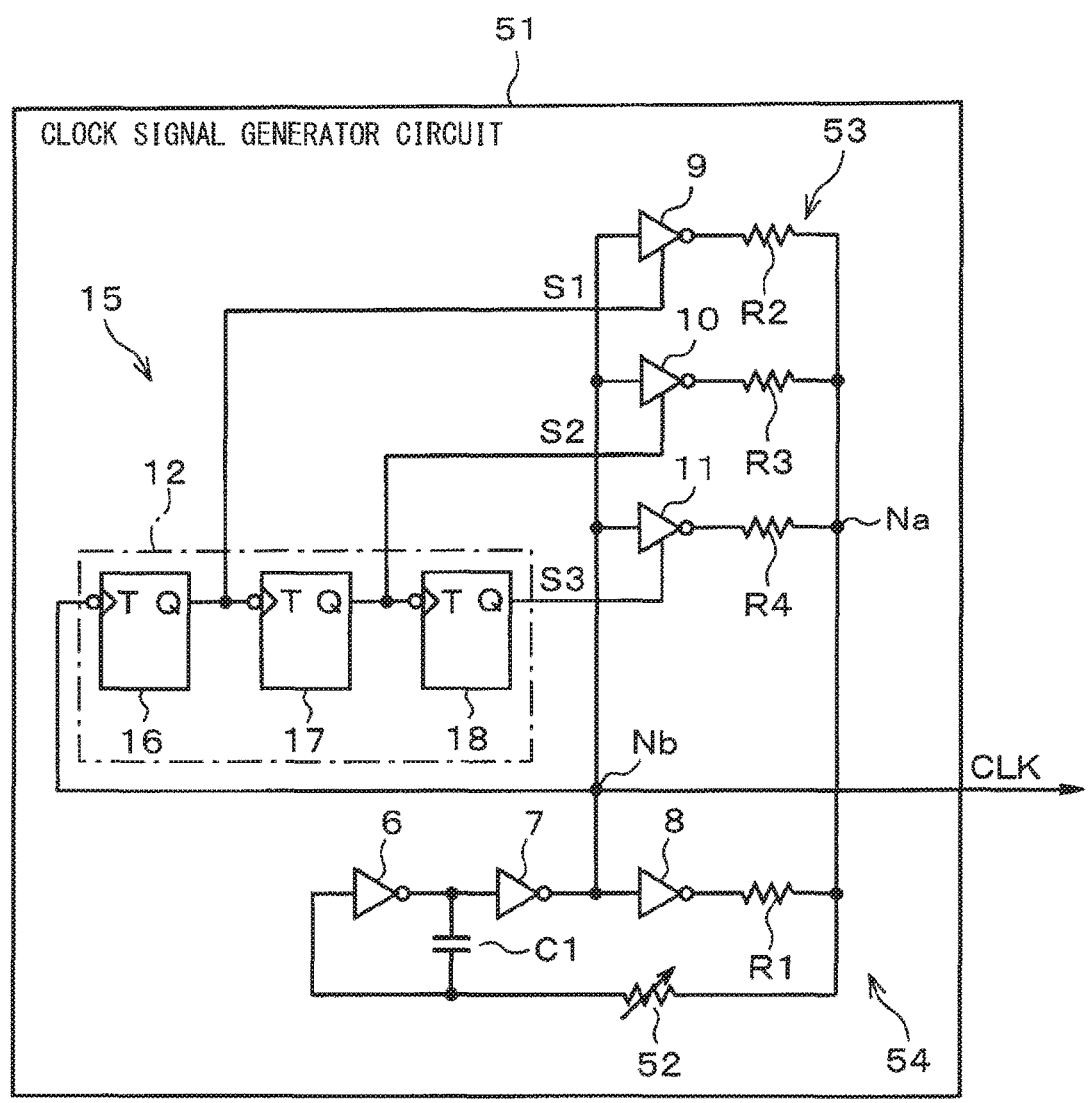
FIG. 12 is a schematic diagram showing a detailed configuration of a clock signal generator circuit according to a fifth embodiment.

As shown in FIG. 12, a clock generator circuit 51 according to the fifth embodiment is different from the clock signal generator circuit 1 of the first embodiment in that a variable resistor 52 is provided in place of the resistive element R5. A CR oscillator part 54 is formed of the capacitor C1, a resistor 53, which is formed of the resistive elements R1 to R4 and the variable resistor 52, and the buffers 6 to 11. The variable resistor 52 is a trimming resistor, which is capable of being laser-trimmed, and is an adjustment part for adjusting a resistance value of the resistor 53.

The fifth embodiment described above also provides the similar advantage as the embodiment described above. Further, since the variable resistor 52, the resistance value of which is variable, is provided in the resistor 53 forming the CR oscillator part 54, the frequency of the clock signal CLK can be finely adjusted to a desired value by adjusting the resistance value of the variable resistor 52 in a manufacturing process, for example.

Sixth Embodiment

A sixth embodiment will be described below with reference to FIG. 13.

Figure 13:
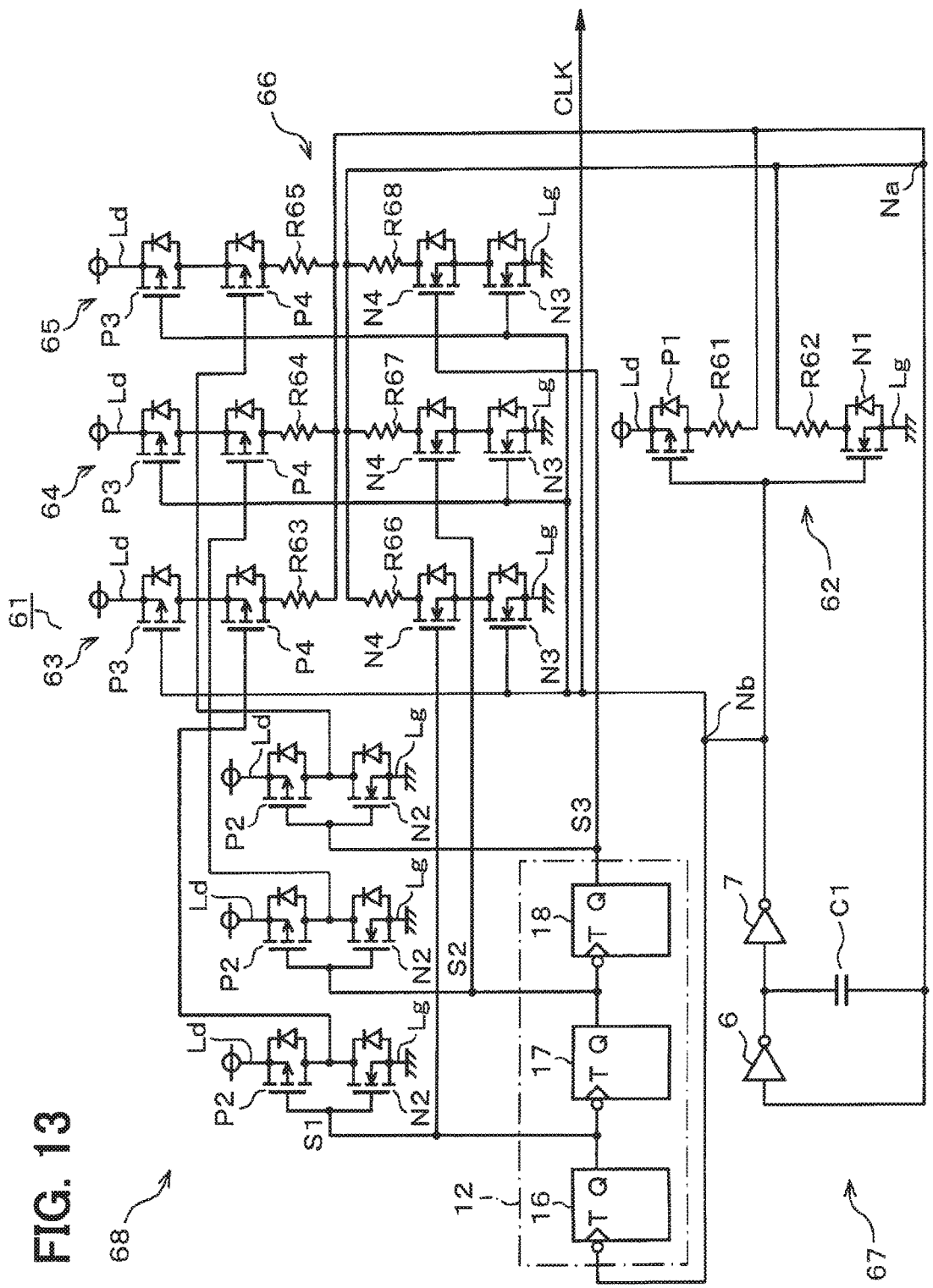
FIG. 13 is a schematic diagram showing a detailed configuration of a clock signal generator circuit according to a sixth embodiment.

As shown in FIG. 13, a clock signal generator circuit 61 according to the sixth embodiment is different from the clock signal generator circuit 1 according to the first embodiment in that buffers 62 to 65 are provided in place of the buffers 8 to 11, resistive elements R61 to R68 are provided in place of the resistive elements R1 to R4 and the resistive element R5 is not provided.

A CR oscillator part 67 is formed of the capacitor C1, a resistor 66, which includes the resistive elements R61 to R68 and the buffers 6, 7 and 62 to 65. The oscillator part 67 thus generates the clock signal CLK, the frequency of which corresponds to a time constant determined by the static capacitance value of the capacitor C1 and the resistance value of the resistor 66. A frequency varying part 68 is formed of the counter 12 and the buffers 62 to 65. The frequency varying part 68 thus varies the frequency of the clock signal by varying the resistance value of the resistor 66 in correspondence to the count value of the counter 12.

The buffer 62 is configured to be a CMOS inverter circuit, which is formed of a transistor P1 and a transistor N1. The transistor P1 is a P-channel MOS transistor. The transistor N1 is an N-channel MOS transistor. A source of the transistor P1 is connected to a power supply line Ld, to which a circuit power supply voltage (for example, +5V) is supplied. A drain of the transistor P1 is connected to the node Na through the resistive element R61.

A source of the transistor N1 is connected to a ground line Lg, to which a ground potential (for example, 0V) is supplied as a circuit reference potential. A drain of the transistor N1 is connected to the node Na through the resistive element R62. A gate of each of the transistors N1 and P1 is connected to the node Nb.

The buffers 63 to 65 are all tri-state inverters and have the same circuit configurations. For this reason, only the configuration of the buffer 63 will be described below. Unless otherwise specifically described, each configuration of the buffers 64 and 65 is designated with the same reference numerals as those of the buffer 63 to simplify the description.

The buffer 63 is formed of transistors P2 to P4, which are P-channel MOS transistors, and transistors N2 to N4, which are N-channel MOS transistors. The transistors P2 and N2 form a CMOS inverter circuit connected between the power supply line Ld and the ground line Lg. The output signal S1 is applied to a common gate of such transistors. In case of the buffers 64 and 65, the output signals S2 and S3 are applied to common gates of the transistors P2 and N2.

A source of the transistor P3 is connected to the power supply line Ld and a drain of the same is connected to a source of the transistor P4. A gate of the transistor P3 is connected to the node Nb. To a gate of the transistor P4, an output signal of the CMOS inverter circuit formed of the transistors P2 and N2 is applied. A drain of the transistor P4 is connected to the node Na through the resistive element R63. In case of the buffers 64 and 65, the drains of the transistors P4 are connected to the node Na through the resistive elements R64 and R65, respectively.

A source of the transistor N3 is connected to the ground line Lg and a drain of the same is connected to a source of the transistor N4. A gate of the transistor N3 is connected to the node Nb. The output signal S1 is applied to the gate of the transistor N4. A drain of the transistor N4 is connected to the node Na through the resistive element R66.

In case of the buffers 64 and 65, the output signals S2 and S3 are applied to the gates of the transistors N4, respectively. The drains of the transistors N4 are connected to the node Na through the resistive elements R67 and R64, respectively. The sixth embodiment, in which the configuration of the tri-state buffers of the frequency varying part and the configuration of the resistor of the CR oscillator part are varied, also provides the similar advantage as the first embodiment.

Other Embodiment

The clock signal generator circuit is not limited to each embodiment described above but may be modified or combined arbitrarily.

In each embodiment described above, the clock signal generator is applied to the clock signal generator circuit, which generates the clock signal used in the charge pump circuit 5 of the high-side driver 2 for vehicle use. However, the clock signal generator circuit may be applied to any circuits, which generate clock signals for use in situations where high frequency noise need be reduced.

The detailed configuration of a buffer, which is switchable between the normal operation state and the high impedance state, is not limited to the configuration of each embodiment described above and may be modified suitably. The detailed configuration of the CR oscillator part is not limited to the configuration of each embodiment described above and may be modified suitably. The detailed configuration of the counter for performing the counting operation is not limited to the configuration of each embodiment described above and may be modified suitably. The counting operation performed by the counter is not limited to only up-counting but may be down-counting.

The operation part is not limited to the counter 12, 22, 32 or 42 as far as it is configured to perform a predetermined operation and outputs a signal corresponding to its operation state. For example, the operation part may be a state machine, which changes its state in correspondence to the state of the CR oscillation part.

What is claimed is:

1. A clock signal generator circuit comprising:
a CR oscillator part including a capacitor and a resistor and outputting from a first common node a clock signal having a frequency corresponding to a time constant determined by the capacitor and the resistor; and
a frequency varying part including an operation part, which performs a predetermined operation and outputs a signal corresponding to its operation state, and varying the frequency of the clock signal by varying a resistance value of the resistor in correspondence to the signal outputted from the operation part,
wherein the resistor includes plural resistive elements, one terminal of each of which is connected in parallel to a second common node different from the first common node,
the frequency varying part includes plural buffers having input terminals connected in common to the first common node, and output terminals connected to other terminals of the resistive elements, respectively, and are switchable between a normal operation state and a high impedance state, and
the frequency varying part varies the resistance value of the resistor by switching over states of the buffers in correspondence to the signal outputted from the operation part.

2. The clock signal generator circuit according to claim 1, wherein:
the operation part is a counter, which performs a counting operation as the predetermined operation and outputs a signal indicating a count value.

3. The clock signal generator circuit according to claim 1, wherein:
the frequency varying part performs a switchover operation so that at least one of the plural buffers is set to the normal operation state.

4. The clock signal generator circuit according to claim 1, wherein:
at least one of the plural buffers is set to remain in the normal operation state continuously.

5. The clock signal generator circuit according to claim 1, wherein:
the clock signal is applied to a charge pump circuit as an operation clock.

6. The clock signal generator circuit according to claim 1, wherein:
a frequency of the clock signal is set to be equal to or higher than 1 MHz.

7. The clock signal generator circuit according to claim 1, wherein:
a modulation rate, which is determined by dividing a variation amount of the frequency of the clock signal by an average value of the frequency of the clock signal, is equal to or higher than 0.02.

8. A clock signal generator circuit comprising:
a CR oscillator part including a capacitor and a resistor and outputting a clock signal having a frequency corresponding to a time constant determined by the capacitor and the resistor; and
a frequency varying part including an operation part, which performs a predetermined operation and outputs a signal corresponding to its operation state, and varying the frequency of the clock signal by varying a resistance value of the resistor in correspondence to the signal outputted from the operation part,
wherein
the resistor includes plural resistive elements, one terminals of which are connected to a common node,
the frequency varying part includes plural buffers having input terminals connected in common and output terminals connected to other terminals of the resistive elements, respectively, and are switchable between a normal operation state and a high impedance state,
the frequency varying part varies the resistance value of the resistor by switching over states of the buffers in correspondence to the signal outputted from the operation part, and
the operation part is a counter, which performs a counting operation as the predetermined operation and outputs a signal indicating a count value.

9. The clock signal generator circuit according to claim 8, wherein:
the counter counts the clock signal as a clock in the counting operation.

10. The clock signal generator circuit according to claim 8, wherein:
the counter performs counting up or counting down as the counting operation.

11. The clock signal generator circuit according to claim 8, wherein:
the counter performs both of counting up and down as the counting operation.

12. The clock signal generator circuit according to claim 8, wherein:
the counter is a binary counter.

13. The clock signal generator circuit according to claim 8, wherein:
the counter is a ring counter.

14. The clock signal generator circuit according to claim 8, wherein:
the frequency varying part performs a switchover operation so that at least one of the plural buffers is set to the normal operation state.

15. The clock signal generator circuit according to claim 8, wherein:
at least one of the plural buffers is set to remain in the normal operation state continuously.

16. The clock signal generator circuit according to claim 8, further comprising:
an adjustment part for adjusting the resistance value of the resistor.

17. The clock signal generator circuit according to claim 8, wherein:
the clock signal is applied to a charge pump circuit as an operation clock.

18. The clock signal generator circuit according to claim 8, wherein:
a frequency of the clock signal is set to be equal to or higher than 1 MHz.

19. A clock signal generator circuit comprising:
a CR oscillator part including a capacitor and a resistor and outputting a clock signal having a frequency corresponding to a time constant determined by the capacitor and the resistor; and
a frequency varying part including an operation part, which performs a predetermined operation and outputs a signal corresponding to its operation state, and varying the frequency of the clock signal by varying a resistance value of the resistor in correspondence to the signal outputted from the operation part,
wherein
the resistor includes plural resistive elements, one terminals of which are connected to a common node,
the frequency varying part includes plural buffers having input terminals connected in common and output terminals connected to other terminals of the resistive elements, respectively, and are switchable between a normal operation state and a high impedance state,
the frequency varying part varies the resistance value of the resistor by switching over states of the buffers in correspondence to the signal outputted from the operation part, and
a modulation rate, which is determined by dividing a variation amount of the frequency of the clock signal by an average value of the frequency of the clock signal, is equal to or higher than 0.02.

20. The clock signal generator circuit according to claim 19, wherein:
the modulation rate is equal to or higher than 0.129.

* * * * *